(12) United States Patent
Huettner et al.

(10) Patent No.: US 7,347,666 B2
(45) Date of Patent: Mar. 25, 2008

(54) AMD PACKAGING APPARATUS FOR MINIMAL EXTERNAL SPACE, HOT PLUG, AND REDUNDANT INSTALLATION

(75) Inventors: Cary Michael Huettner, Rochester, MN (US); Paul Jeffrey La Rocca, Rochester, MN (US); Kenneth Edward Lubahn, Oronoca, MN (US); Matthew Carl Zehrer, Saint Paul, MN (US)

(73) Assignee: International Business Machines Corporation, Armonk, NY (US)

( * ) Notice: Subject to any disclaimer, the term of this patent is extended or adjusted under 35 U.S.C. 154(b) by 249 days.

(21) Appl. No.: 11/340,343

(22) Filed: Jan. 26, 2006

(65) Prior Publication Data
US 2007/0172353 A1 Jul. 26, 2007

(51) Int. Cl.
*F03B 11/02* (2006.01)

(52) U.S. Cl. .................... 415/213.1; 361/695
(58) Field of Classification Search ............ 415/213.1, 415/214.1, 220, 223; 361/687, 695, 697; 454/184
See application file for complete search history.

(56) References Cited

U.S. PATENT DOCUMENTS

| | | | |
|---|---|---|---|
| 6,094,345 A | * | 7/2000 | Diemunsch ............... 361/695 |
| 6,711,015 B2 | * | 3/2004 | Syring et al. ............. 361/695 |
| 7,261,516 B2 | * | 8/2007 | Liang et al. ............ 415/213.1 |

* cited by examiner

*Primary Examiner*—Edward K. Look
*Assistant Examiner*—Dwayne J White
(74) *Attorney, Agent, or Firm*—Joan Pennington

(57) ABSTRACT

Air moving device (AMD) packaging apparatus includes an AMD carriage structure and an associated frame receiving the AMD carriage structure. The AMD carriage structure includes an AMD holder section pivotally connected to a driver section. The associated frame is mounted in a housing of a system to be cooled and includes elongated slots defining cooperating tracks for receiving the AMD carriage structure. The AMD holder section and the driver section include outwardly extending protrusions or posts slideably received within the cooperating tracks in the associated frame to position an AMD contained within the AMD holder section in an operating position within the associated frame.

18 Claims, 5 Drawing Sheets

AMD PACKAGING APPARATUS FOR MINIMAL EXTERNAL SPACE, HOT PLUG, AND REDUNDANT INSTALLATION

FIELD OF THE INVENTION

The present invention relates generally to the data processing field, and more particularly, relates to air moving device (AMD) packaging apparatus requiring minimal external space, enabling hot plugging, and redundant installation.

DESCRIPTION OF THE RELATED ART

Given various systems and various designs, sometimes there is not enough frontal or rear area to be able to plug an air moving device (AMD) and also to properly locate the AMD in an internal area of a system where it is needed to be located for proper thermal cooling.

A need exists for an effective packaging apparatus for an AMD that enables installation of the AMD in an internal area of a drawer, frame, rack or the like, while requiring minimal external space.

It is desirable to provide such packaging apparatus that enables convenient and easy installation and removal of the AMD. It is desirable to provide such packaging apparatus that minimizes external space needed for the installation and removal of the AMD.

It is desirable to provide such packaging apparatus that enables hot plugging of the AMD without shutting down the associated system that is being cooled, and that also enables redundant installation of AMDs.

SUMMARY OF THE INVENTION

A principal aspect of the present invention is to provide air moving device (AMD) packaging apparatus requiring minimal external space, enabling hot plugging, and redundant installation. Other important aspects of the present invention are to provide such AMD packaging apparatus substantially without negative effect and that overcome some disadvantages of prior art arrangements.

In brief, air moving device (AMD) packaging apparatus includes an AMD carriage structure and an associated frame receiving the AMD carriage structure. The AMD carriage structure includes an AMD holder section pivotally connected to a driver section. The associated frame is mounted in a housing of a system to be cooled and includes elongated slots defining cooperating tracks for receiving the AMD carriage structure. The AMD holder section and the driver section include outwardly extending protrusions or posts slideably received within the cooperating tracks in the associated frame to position an AMD contained within the AMD holder section in an operating position within the associated frame.

In accordance with features of the invention, the outwardly extending protrusions of the AMD holder section are located on opposed sides near a first end of the AMD holder section that is inserted first within an access face portion of the associated frame. The outwardly extending protrusions of the driver section are located on opposed sides of the driver section spaced apart from the pivot connection to the AMD holder section. A distal end opposite the pivot connection of the driver section is located near the access face portion of the associated frame in the ADM operating position. The AMD carriage structure is removed from the associated frame by pulling on the distal end of the driver section.

In accordance with features of the invention, the elongated slots defining cooperating tracks for receiving the AMD carriage structure include an elongated first portion generally related to a length of the driver section and a ramp portion generally related to a length of the AMD holder section for positioning the AMD within the system to be cooled.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the preferred embodiment, air moving device (AMD) packaging apparatus essentially allows for the placement of an AMD through a very small opening in an access side of a system, normally in the front or back of the system. Once in place the AMD then is provided in an optimal position for effective thermal cooling of a system. The AMD packaging apparatus includes a mechanical ramp or a linkage system for properly locating the AMD. The AMD packaging apparatus allows for not only the proper location but also for docking and positive retention of an entire system for quality and reliability. The AMD packaging apparatus includes multiple parts having selected sizes to accommodate generally all types of AMDs.

Figure 1:
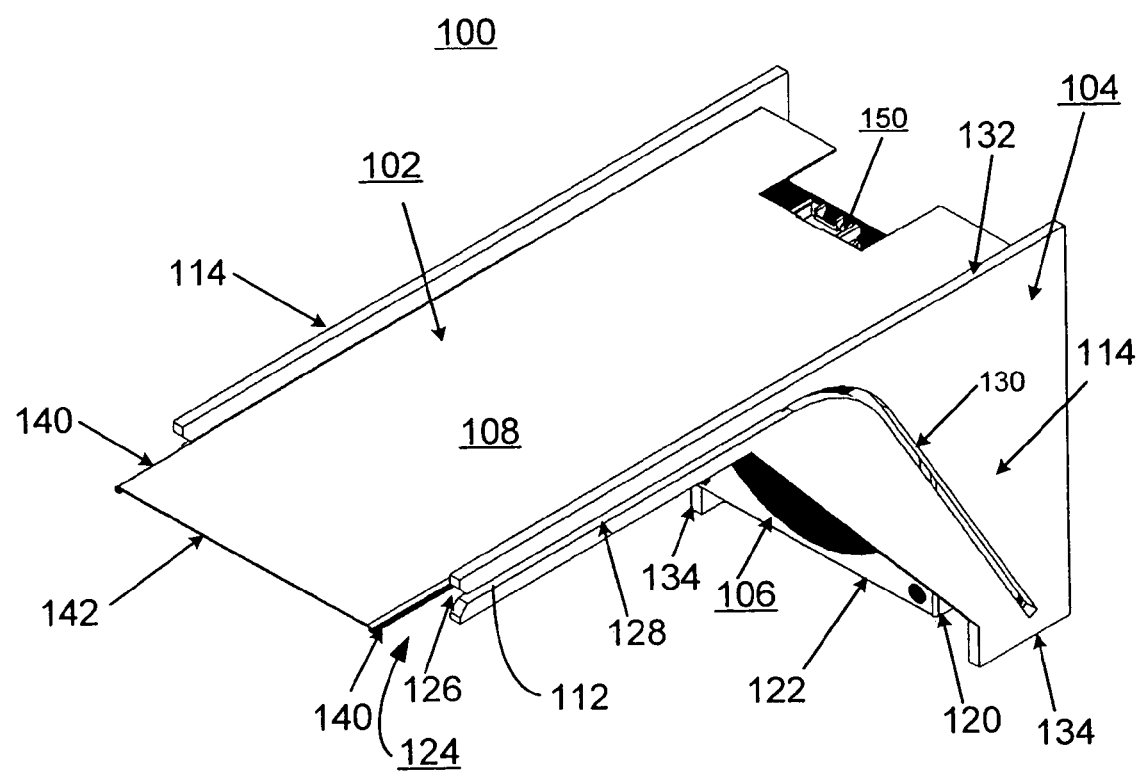
FIG. 1 is a perspective view illustrating air moving device (AMD) packaging apparatus in accordance with the preferred embodiment.
Figure 2:
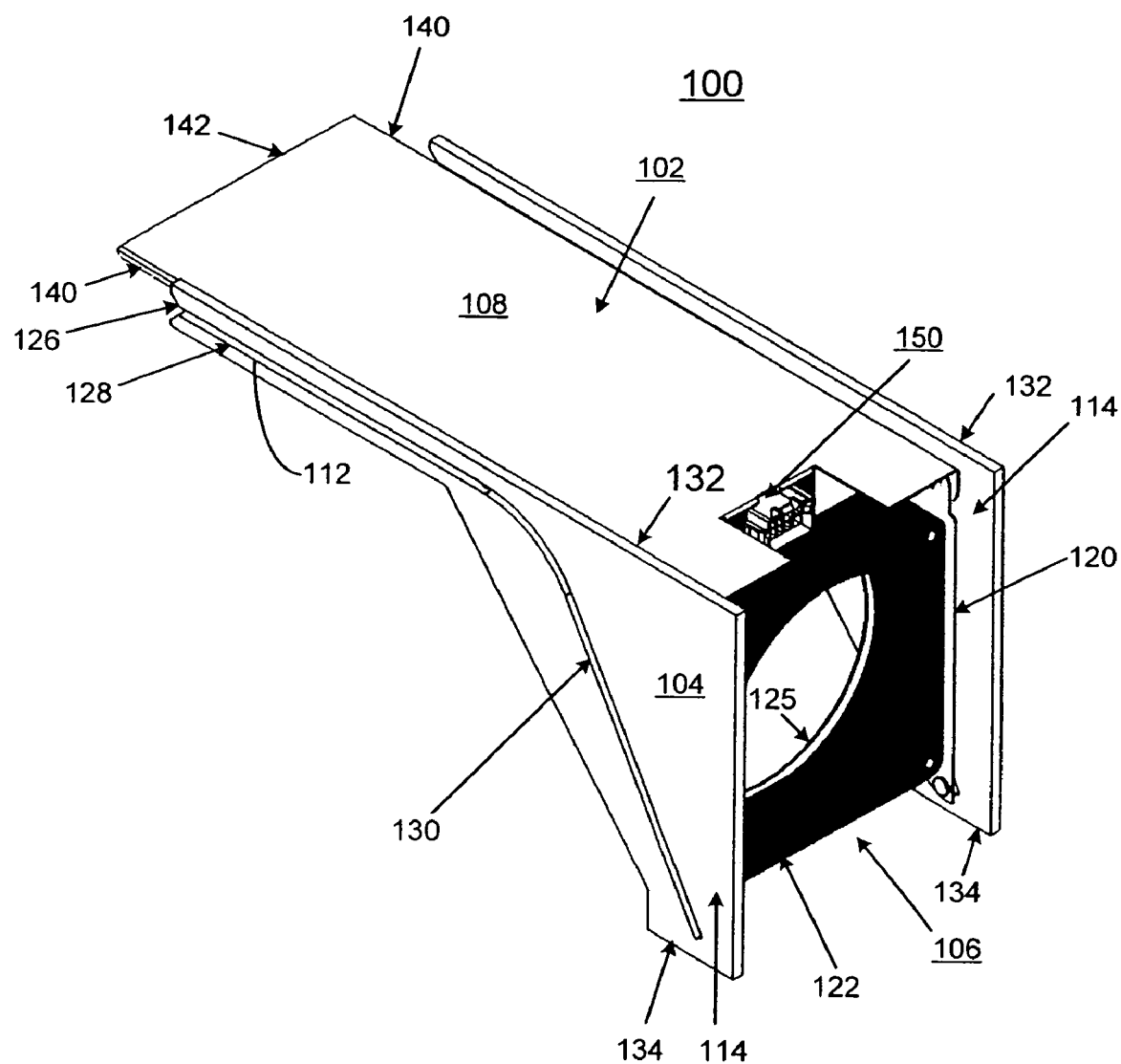
FIG. 2 is a perspective view illustrating an opposite end of the air moving device (AMD) packaging apparatus of FIG. 1 in accordance with the preferred embodiment.

Having reference now to the drawings, in FIGS. 1 and 2, there is shown air moving device (AMD) packaging apparatus generally designated by the reference character 100 in accordance with the preferred embodiment. AMD packaging apparatus 100 includes an AMD carriage structure generally designated by the reference character 102 and an associated frame generally designated by the reference character 104 receiving the AMD carriage structure 102.

Figure 3:
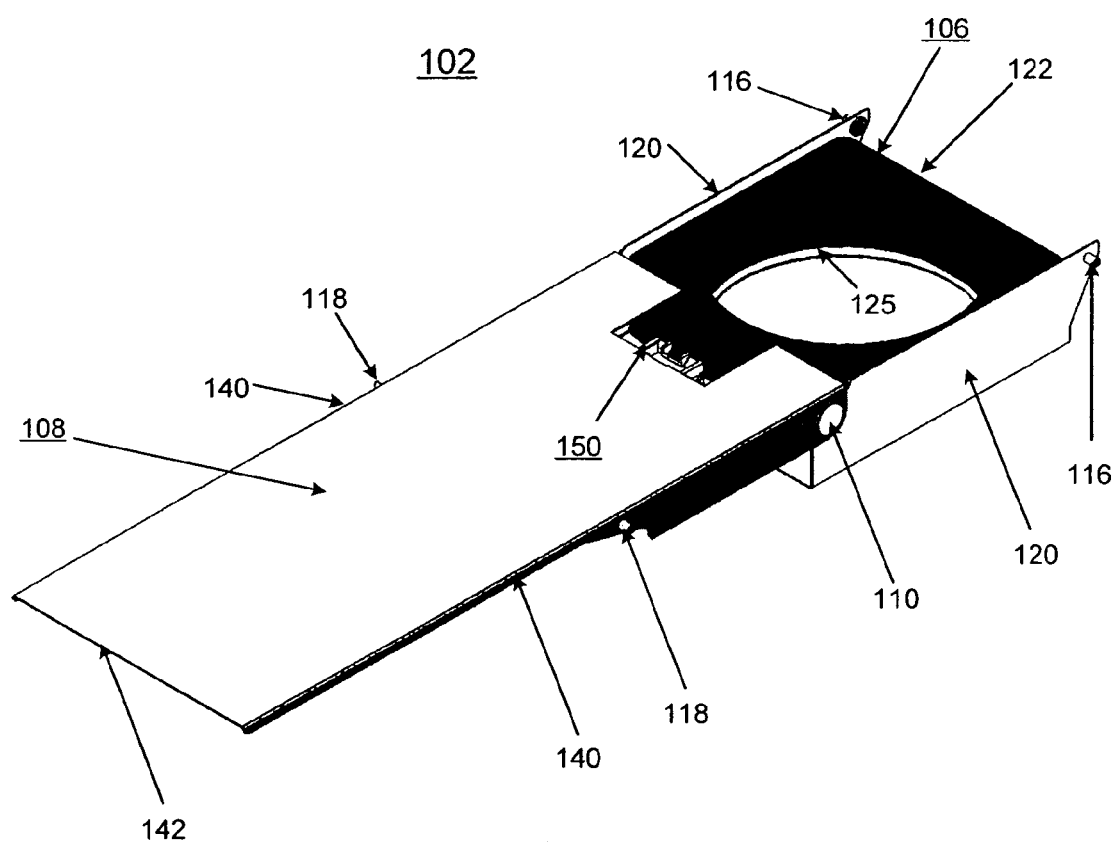
FIG. 3 is a perspective view illustrating an AMD carriage structure of the air moving device (AMD) packaging apparatus of FIG. 1 in accordance with the preferred embodiment.

Referring also to FIG. 3, the AMD carriage structure 102 includes an AMD holder section (shown shaded) generally designated by the reference character 106 pivotally connected to a driver section generally designated by the reference character 108 by a pivot connection 110.

Figure 4:
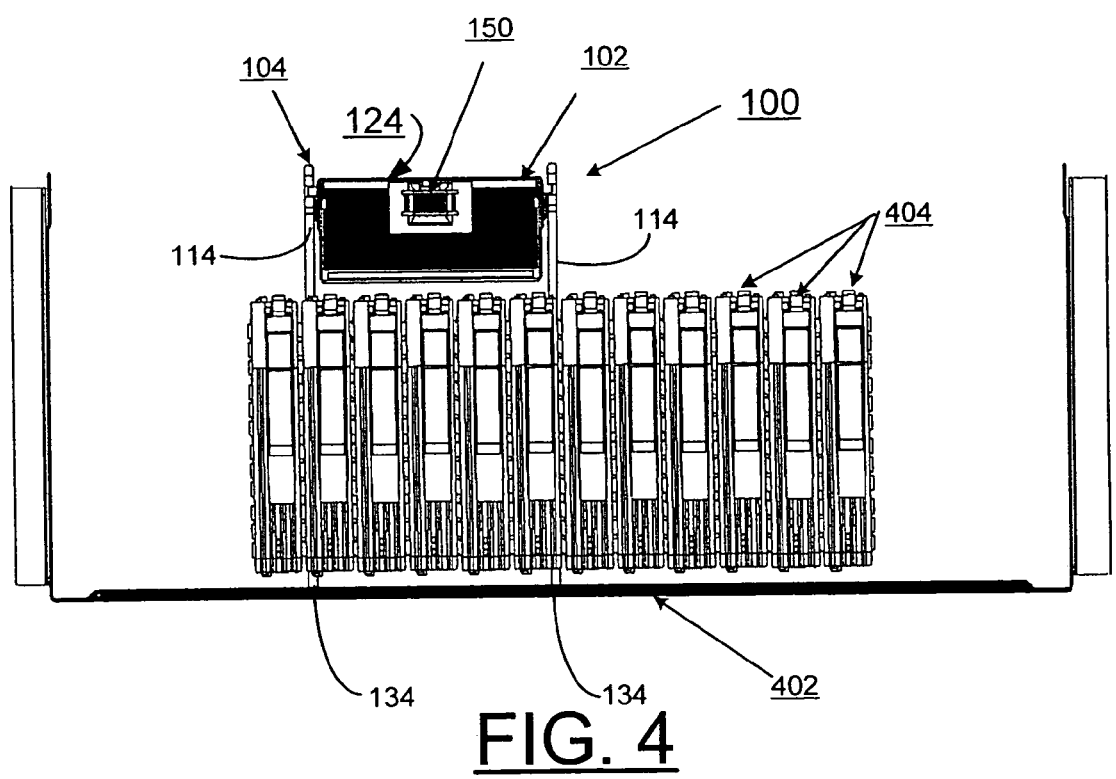
FIG. 4 is a front view illustrating an exemplary system including the air moving device (AMD) packaging apparatus of FIG. 1 in accordance with the preferred embodiment.
Figure 5:
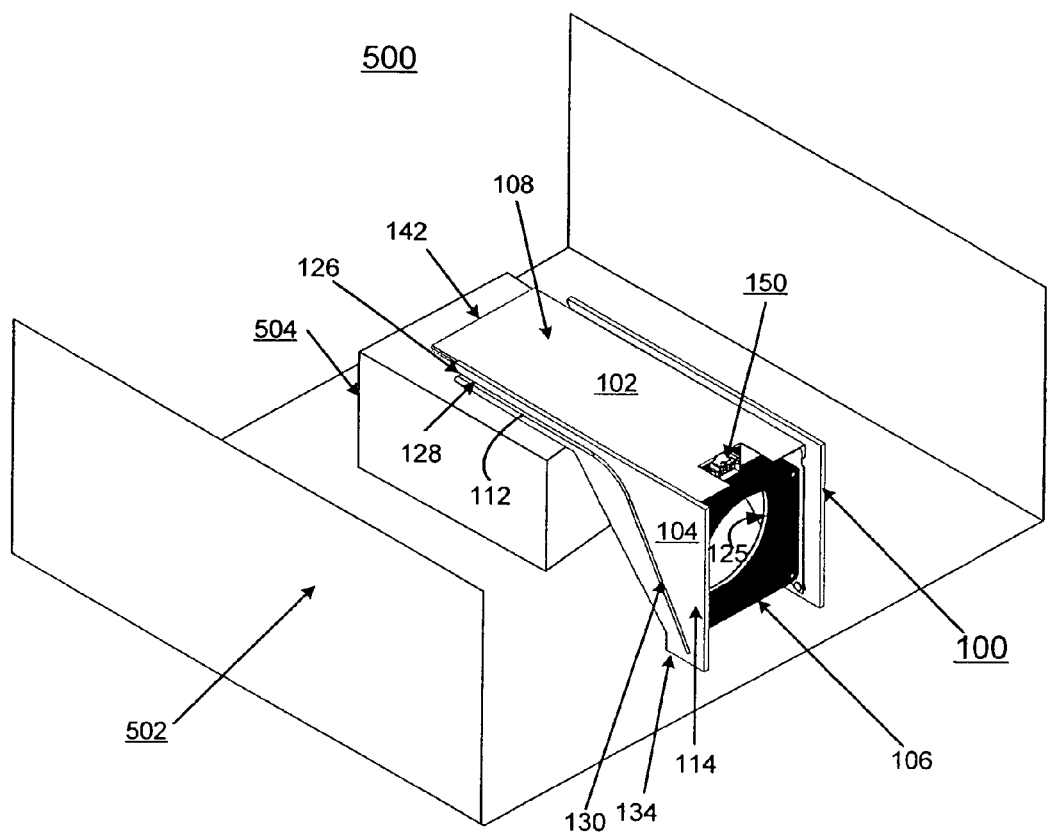
FIG. 5 is a perspective view illustrating another exemplary system including the air moving device (AMD) packaging apparatus of FIG. 1 in accordance with the preferred embodiment.

The associated frame 104 includes elongated slots 112, each of the slots 112 formed in an opposing sidewall 114 of the associated frame 104. The associated frame 104 is mounted in a housing of a system to be cooled, for example, as illustrated in FIGS. 4 and 5.

The opposing sidewalls 114 of the associated frame 104 are spaced apart by a set distance related to the size of the AMD carriage structure 102. The elongated slots 112 define cooperating tracks for receiving and positioning the AMD carriage structure 102 within a particular system housing.

Each of the AMD holder section 106 and the driver section 108 includes a respective pair of outwardly extending protrusions or posts 116, 118 slideably received within the cooperating tracks 112 in the associated frame 104 to position an AMD contained within the AMD holder section 106 in an operating position within the associated frame 104.

Each of the outwardly extending protrusions 116 of the AMD holder section 106 is located on an opposed sidewall 120 near a first end 122 of the AMD holder section 106. The first end 122 is inserted first within an access face portion generally designated by the reference character 124 of the associated frame 104. As shown, AMD holder section 106 includes a generally centrally located, circular opening 125 for receiving and retaining an AMD. Various different types and sizes of AMDs can be used, such as various tube axial fans and various blower can be used for the AMD, and AMD holder section 106 is suitably configured for a particular AMD.

It should be understood that the present invention is not limited to the illustrated AMD packaging apparatus 100. For example, various sizes for the AMD carrier structure 102, the associated frame 104, and the shape and location of AMD receiving opening 125 are selectively provided for various available AMDs to be used with AMD packaging apparatus 100.

The elongated slots 112 include a tapered opening 126 to facilitate slidingly receiving the outwardly extending protrusions 116 when the AMD carrier structure is first inserted and pushed into the associated frame 104. The elongated slots 112 include an elongated first portion 128 having a selected length related to a length of the driver section 108 and a ramp portion 130 having a selected length and angle generally related to a length of the AMD holder section 106 for positioning the AMD within the system to be cooled. The ramp portion 130 extends along a line from near an upper side 132 to a lower side 134 of the sidewalls 114 of the associated frame 104.

The outwardly extending protrusions 118 of the driver section 108 are located on opposed sides 140 of the driver section spaced apart from the pivot connection 110 to the AMD holder section 106. A distal end 142 opposite the pivot connection 110 of the driver section 108 extends beyond the access face portion 124 of the associated frame in the ADM operating position. The AMD carriage structure 102 easily is removed from the associated frame 104 by pulling on the distal end 142 of the driver section 108.

A connector generally designated by the reference character 150 connects the AMD contained within the AMD holder section 106 to a power source (not shown). Connector 150 is mounted onto the AMD holder section 106 near the pivot connection 110 of the AMD holder section 106 and the driver section 108.

Connector 150 is disposed near the upper side 132 of frame sidewalls 114 with the AMD carriage structure 102 inserted into the frame 104 with the AMD provided in an operating position within the associated frame 104, for convenient and easy connection with the power source. Connector 150 alternatively can be mounted onto the AMD holder section 106 near the first end 122 for mating, for example, with a power source located with a supporting surface for AMD packaging apparatus 100.

AMD packaging apparatus 100 optionally includes an active circuit card, for example mounted to connector 150, for enabling apparatus 100 to function as a smart device.

Each of the AMD carriage structure 102 and the associated frame 104 preferably is formed of an electrically nonconductive material, such as a rigid plastic material. It should be understood that the AMD carriage structure 102 and the associated frame 104 can be formed of a metal material, such as a galvanized steel. AMD carriage structure 102 and the associated frame 104 can be formed, for example, by injection molding technique.

In accordance with features of the preferred embodiment, AMD packaging apparatus 100 enables convenient and easy installation and removal of the AMD. As shown in FIGS. 4 and 5, AMD packaging apparatus 100 requires minimal space for installation and removal. AMD packaging apparatus 100 enables hot plugging of the AMD without shutting down the associated system that is being cooled, and also enables redundant installation of AMDs.

Referring now to FIG. 4, an exemplary system generally designated by the reference character 400 includes AMD packaging apparatus 100 in accordance with the preferred embodiment. System 400 advantageously includes multiple AMDs, for example, each including AMD packaging apparatus 100 (one shown) for providing redundant installation of AMDs. For example, multiple AMD packaging apparatus 100 can be installed side by side with the illustrated AMD packaging apparatus 100, and multiple AMD packaging apparatus 100 can be installed with the illustrated AMD packaging apparatus 100 and rotated by 900 from the illustrated AMD packaging apparatus 100.

The associated frame 104 of AMD packaging apparatus 100 is fixedly secured at the lower frame sides 134 to a housing 402, such as a drawer, frame, rack or the like of system installation 400. System 400 includes, for example, a plurality of drive units 404 with a generally small space provided above or minimal access face portion 124 for installing and removing the AMD carrier structure 102 of AMD packaging apparatus 100. AMD carrier structure 102 locates an AMD or fan (not shown) behind the drive units 404 within an interior portion of the housing 402, AMD packaging apparatus 100 facilitating easy installation and removal of the associated AMD.

Referring now to FIG. 5, another exemplary system generally designated by the reference character 500 includes AMD packaging apparatus 100 in accordance with the preferred embodiment. System 500 advantageously can include multiple AMDs, for example, each including AMD packaging apparatus 100 (one shown) for providing redundant installation of AMDs.

System 500 includes a housing 502 with the associated frame 104 of AMD packaging apparatus 100 fixedly secured at the lower frame side 134 within an interior of housing 502 behind a system component generally designated by the reference character 504. The AMD (not shown) contained within the AMD holder section 106 is located within the housing interior in an optimal position for effective thermal cooling of system 500.

While the present invention has been described with reference to the details of the embodiments of the invention shown in the drawing, these details are not intended to limit the scope of the invention as claimed in the appended claims.

What is claimed is:

1. Air moving device (AMD) packaging apparatus comprising:
   an AMD carriage structure including an AMD holder section and a driver section;
   said AMD holder section containing an AMD and being pivotally connected to said driver section;
   an associated frame receiving the AMD carriage structure;
   said associated frame being mounted in a housing of a system to be cooled and said associated frame including a pair of elongated slots defining cooperating tracks for receiving the AMD carriage structure;
   said AMD holder section and said driver section including outwardly extending protrusions slideably received within said cooperating tracks of said associated frame to position said AMD contained within said AMD holder section in an operating position within the associated frame.

2. AMD packaging apparatus as recited in claim 1 wherein said outwardly extending protrusions of said AMD holder section are located on opposed sides near a first end of the AMD holder section, said first end being first inserted within an access face portion of said associated frame.

3. AMD packaging apparatus as recited in claim 1 wherein said outwardly extending protrusions of said driver section are located on opposed sides of said driver section spaced apart from a pivot connection to said AMD holder section.

4. AMD packaging apparatus as recited in claim 3 wherein a distal end of said driver section opposite said pivot connection is located near said access face portion of said associated frame in the ADM operating position.

5. AMD packaging apparatus as recited in claim 4 wherein said AMD carriage structure is removed from said associated frame by pulling on said distal end of said driver section.

6. AMD packaging apparatus as recited in claim 1 wherein said elongated slots defining cooperating tracks for receiving the AMD carriage structure include an elongated first portion and a ramp portion.

7. AMD packaging apparatus as recited in claim 6 wherein said elongated first portion has a predefined length related to a length of said driver section.

8. AMD packaging apparatus as recited in claim 6 wherein said ramp portion has a predefined length related to a length of the AMD holder section for positioning said AMD within the system to be cooled.

9. AMD packaging apparatus as recited in claim 1 wherein said AMD carriage structure and said associated frame are formed of an electrically nonconductive material.

10. AMD packaging apparatus as recited in claim 1 wherein said AMD carriage structure and said associated frame are formed by injection molding.

11. Air moving device (AMD) packaging apparatus comprising:
    an AMD carriage structure including an AMD holder section and a driver section;
    said AMD holder section containing an AMD and being pivotally connected to said driver section;
    an associated frame receiving the AMD carriage structure;
    said associated frame including a pair of opposing sidewall being fixedly mounted within a housing interior of a system to be cooled and said associated frame including a respective elongated slot in each said opposing sidewall, said elongated slots defining cooperating tracks for receiving the AMD carriage structure;
    said AMD holder section and said driver section including outwardly extending protrusions slideably received within said cooperating tracks of said associated frame to position said AMD contained within said AMD holder section in an operating position within the associated frame.

12. Air moving device (AMD) packaging apparatus as recited in claim 11 wherein said AMD carriage structure and said associated frame are formed of an electrically nonconductive material.

13. Air moving device (AMD) packaging apparatus as recited in claim 11 wherein said AMD carriage structure and said associated frame are formed of a rigid plastic material.

14. Air moving device (AMD) packaging apparatus as recited in claim 11 wherein said AMD holder section includes a opening for receiving and containing the AMD.

15. Air moving device (AMD) packaging apparatus as recited in claim 11 wherein said driver section includes an elongated ledge having a predefined length for positioning said AMD contained within said AMD holder section at a selected location within said housing interior of a system to be cooled.

16. Air moving device (AMD) packaging apparatus as recited in claim 11 wherein said elongated slots defining cooperating tracks for receiving the AMD carriage structure include an elongated first portion and a ramp portion.

17. Air moving device (AMD) packaging apparatus as recited in claim 16 wherein said elongated first portion has a predefined length related to a length of said driver section.

18. Air moving device (AMD) packaging apparatus as recited in claim 16 wherein said ramp portion has a predefined length related to a length of the AMD holder section for positioning said AMD within the system to be cooled.

* * * * *